(12) United States Patent
Yi et al.

(10) Patent No.: US 8,916,850 B2
(45) Date of Patent: Dec. 23, 2014

(54) LIGHT-EMITTING ELEMENT AND METHOD FOR MANUFACTURING SAME

(75) Inventors: Gyuchul Yi, Seoul (KR); Chulho Lee, Seoul (KR); Yongjin Kim, Seoul (KR)

(73) Assignee: SNU R&DB Foundation, Seoul (KR)

( * ) Notice: Subject to any disclaimer, the term of this patent is extended or adjusted under 35 U.S.C. 154(b) by 0 days.

(21) Appl. No.: 13/878,251

(22) PCT Filed: Oct. 7, 2011

(86) PCT No.: PCT/KR2011/007460
§ 371 (c)(1),
(2), (4) Date: Apr. 8, 2013

(87) PCT Pub. No.: WO2012/047068
PCT Pub. Date: Apr. 12, 2012

(65) Prior Publication Data
US 2013/0187128 A1    Jul. 25, 2013

(30) Foreign Application Priority Data
Oct. 7, 2010    (KR) .................. 10-2010-0097840

(51) Int. Cl.
| H01L 29/06 | (2006.01) |
|---|---|
| H01L 33/24 | (2010.01) |
| H01L 33/04 | (2010.01) |
| B82Y 20/00 | (2011.01) |
| H01L 33/16 | (2010.01) |
| H01L 33/34 | (2010.01) |
| H01L 33/64 | (2010.01) |
| H01L 33/18 | (2010.01) |
| H01L 33/00 | (2010.01) |
| H01L 33/08 | (2010.01) |

(52) U.S. Cl.
CPC ................. *H01L 33/34* (2013.01); *H01L 33/24* (2013.01); *H01L 33/641* (2013.01); *H01L 33/18* (2013.01); *H01L 33/04* (2013.01); *H01L 33/0079* (2013.01); *B82Y 20/00* (2013.01); *H01L 33/005* (2013.01); *H01L 33/16* (2013.01); *H01L 33/08* (2013.01)
USPC ................................ 257/13; 257/98; 257/103

(58) Field of Classification Search
USPC .................................................... 257/79–103
See application file for complete search history.

(56) References Cited

U.S. PATENT DOCUMENTS

| 7,858,876 B2 | 12/2010 | Lagally et al. |
| 7,947,989 B2 | 5/2011 | Ha et al. |

(Continued)

FOREIGN PATENT DOCUMENTS

| JP | 2006-332650 A | 12/2006 |
| KR | 10-2009-0003526 A | 1/2009 |

(Continued)

OTHER PUBLICATIONS

Korean Intellectual Property Office, International Search Report in International Patent Application No. PCT/KR2011/007460 (Apr. 10, 2012).

*Primary Examiner* — Matthew W Such
*Assistant Examiner* — Frederick B Hargrove
(74) *Attorney, Agent, or Firm* — The PL Law Group, PLLC

(57) ABSTRACT

The present invention provides a light-emitting element comprising: a carbon layer comprising a graphene; a plurality of fine structures having grown toward the upper side of the carbon layer; and a light-emitting structure layer formed on the surface of the fine structures.

18 Claims, 17 Drawing Sheets

(56) References Cited

U.S. PATENT DOCUMENTS

| | | |
|---|---|---|
| 2007/0041214 A1 | 2/2007 | Ha et al. |
| 2010/0132773 A1 | 6/2010 | Lagally et al. |
| 2011/0272723 A1 | 11/2011 | Ha et al. |
| 2012/0056237 A1* | 3/2012 | Choi et al. .................... 257/103 |
| 2013/0161584 A1* | 6/2013 | Crowder et al. ................. 257/9 |

FOREIGN PATENT DOCUMENTS

| | | |
|---|---|---|
| KR | 10-2009-0123951 A | 12/2009 |
| KR | 10-2010-0074442 A | 7/2010 |
| KR | 10-2010-0082215 A | 7/2010 |

* cited by examiner

LIGHT-EMITTING ELEMENT AND METHOD FOR MANUFACTURING SAME

TECHNICAL FIELD

The present invention relates to a light-emitting element and a method of manufacturing the same.

BACKGROUND ART

A light-emitting diode (LED) is an example of a light-emitting element. An LED is a device that emits light due to electron-hole pairs near a p-n junction or in an active layer by flowing current through a terminal of a compound semiconductor. Recently, advances in semiconductor technologies have led to rapid progress in producing high-quality LEDs. For example, technologies that implement a blue LED with high brightness by forming a III-V group nitride layer on a sapphire substrate using a metal-organic chemical vapor deposition (MOCVD) method are being commercialized.

As described above, a conventional LED has been manufactured by depositing a compound mainly on a sapphire substrate. However, although a sapphire substrate has an excellent light transmission property and mechanical strength, it also has disadvantages such as low thermal conductivity and difficulty in processing. In addition, a laser lift-off process is required to manufacture a vertical type light-emitting diode.

Graphene may be considered as a candidate material for replacing the sapphire substrate. Graphene is a monolayer of carbon atoms which are connected to form a honeycomb-shaped two-dimensional planar structure. An experimental method for obtaining graphene was first reported in 2004 by Ander K. Geim of Manchester University, who mechanically separated graphene from graphite. Since then, physical and chemical characteristics of graphene have been studied, and in recent years, technology for growing graphene on a large substrate having a size of to about 30 inches using chemical vapor deposition (CVD) has emerged. A material having a layered structure with two or more sheets of graphene is graphite. That is, a single layer separated from graphite is graphene.

Graphene has excellent thermal and electrical conductivity, high chemical/mechanical stability, and high transparency. In addition, graphene has high electron mobility, low resistivity, and a large surface area, and has an advantage over carbon nanotubes on a commercial front. Further, graphene or layer-structured graphite including graphene may be easily separated from an original substrate and transferred to another substrate.

In spite of the above-described merits, there have been limits in using graphene in a semiconductor device. In particular, since the surface of graphene is chemically very stable and non-reactive, it is very difficult to grow a microstructure or thin-film on graphene.

DISCLOSURE

Technical Problem

The present invention is directed to a light-emitting element including graphene and a method of manufacturing the same. However, the technical objectives of the present invention are not limited to the above disclosure; other objectives may become apparent to those of ordinary skill in the art based on the following descriptions.

Technical Solution

In accordance with an aspect of the present invention, a light-emitting element includes a carbon layer including graphene, a plurality of microstructures grown upward from the carbon layer, and a light-emitting structure layer formed on surfaces of the microstructures.

In accordance with another aspect of the present invention, a method of manufacturing a light-emitting element includes providing a carbon layer including graphene, growing a plurality of microstructures upward on the carbon layer; and forming a light-emitting structure layer on surfaces of the microstructures.

Advantageous Effects

The present invention provides a light-emitting element including graphene and a method of manufacturing the same. Specifically, the present invention includes forming microstructures on graphene and forming a light-emitting structure layer on surfaces of the microstructures. As a result, it is possible to separate a light-emitting element to be transferred to a variety of substrates.

In addition, since the microstructures have excellent electrical and optical properties due to excellent crystallinity, it is possible to manufacture a high-efficiency light-emitting element. Further, since graphene has excellent electrical conductivity, it is possible to use graphene or graphite as a bottom electrode. Since graphene has excellent thermal conductivity, it is possible to avoid performance degradation of a light-emitting element due to the heat. Other effects of embodiments of the present invention are included in the detailed description and drawings.

Further, since graphene has excellent electrical conductivity, it is possible to use graphene or graphite as a bottom electrode. Since graphene has excellent thermal conductivity, it is possible to avoid performance degradation of a light-emitting element due to the heat. Other effects of embodiments of the present invention are included in the detailed description and drawings.

BEST MODE FOR CARRYING OUT THE INVENTION

Figure 1A:
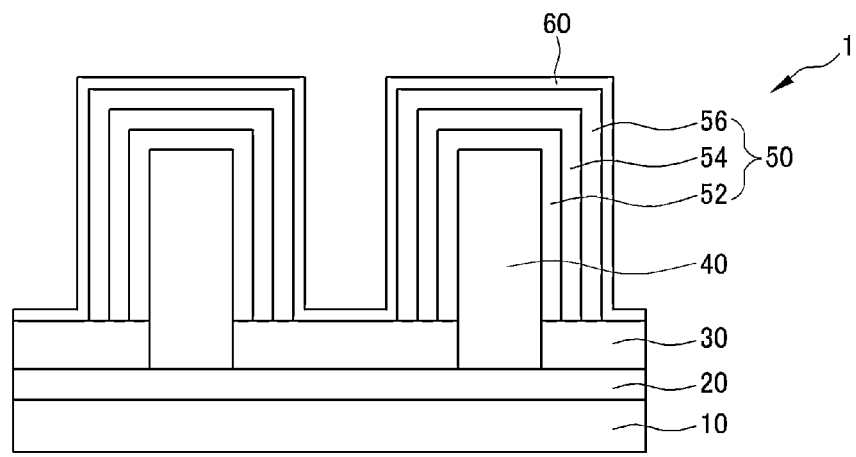
FIG. 1A is a cross-sectional view showing a light-emitting element in accordance with an embodiment of the present invention.

Various embodiments will now be described more fully with reference to the accompanying drawings in which some embodiments are shown. These present inventions may, however, be embodied in different forms and should not be construed as limited to the embodiments set forth herein. Rather, these embodiments are provided so that this disclosure is thorough and complete and fully conveys the present invention to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. Further, it will be understood that when a layer (or film), a region, a pattern, or a structure is referred to as being "on" a substrate, a layer (or film), a region, a pad, or patterns, it can be directly on another layer or substrate, or intervening layers may also be present. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Hereinafter, embodiments of the present invention will be fully described with reference to the accompanying drawings.

Figure 1B:
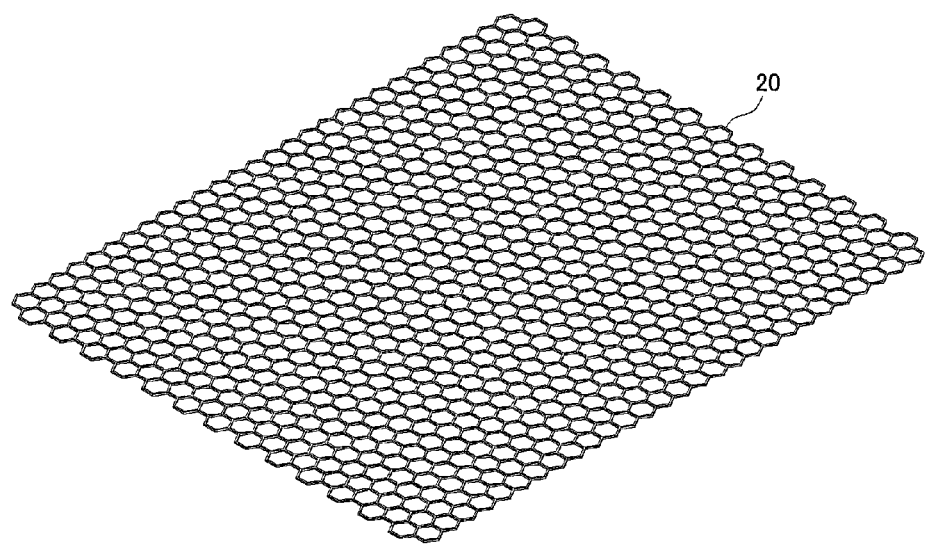
FIG. 1B is a schematic view showing graphene.

FIG. 1A is a cross-sectional view of a light-emitting element in accordance with an embodiment of the present invention, FIG. 1B is a schematic view showing graphene, and FIG. 1C is an enlarged cross-sectional view showing a quantum active layer.

FIG. 1A is a cross-sectional view showing a light-emitting element in accordance with an embodiment of the present invention, and FIG. 1B is a schematic view showing graphene.

Referring to FIG. 1A, a light-emitting element 1 may include a substrate 10, a carbon layer 20, an insulating layer 30, microstructures 40, a light-emitting structure layer 50, and a first electrode layer 60.

The carbon layer 20 may be disposed on the substrate 10. However, when the carbon layer 20 has sufficient mechanical strength, the substrate 10 may not be absolutely necessary, and the carbon layer 20 itself may function as a substrate without using the extra substrate 10.

In addition, the carbon layer 20 may be separable from the substrate 10. Therefore, the carbon layer 20 and other structures thereon may be separated from the substrate 10 and transferred. This will be described in detail later.

The carbon layer 20 may include one or more graphene layers. Graphene is a material with a two-dimensional planar structure in which carbon atoms are connected to each other to form a honeycomb shape, as shown in FIG. 1B. Graphene may have various structures, which depends on the content of five-membered rings and/or seven-membered rings included in the graphene.

A plurality of the microstructures 30 may be placed at arbitrary points on the carbon layer 20. The microstructures 30 are approximately micro- or nano-scale structures, and there is no particular limit on the size or shape thereof. In addition, the microstructures 30 may be formed by growing upward from the carbon layer 20. This means that the microstructures 30 are not required to be formed perpendicular to the carbon layer 20 but formed by a bottom up method in which the microstructures 30 are stacked upward with respect to a plate surface of the carbon layer 20 from a part in contact with the carbon layer 20 as a starting point.

The insulating layer 30 may be disposed on the carbon layer 20. The insulating layer 30 may insulate the carbon layer 20 including conductive graphene from other layers including the first electrode layer 60. There is no limit to the material used for the insulating layer 30, and an oxide such as silicon oxide, aluminum oxide, titanium oxide, mullite, cordierite, spinel, zeolite, or forsterite, a carbide such as boron carbide, a nitride such as silicon nitride, boron nitride, or aluminum nitride, a fluoride such as magnesium fluoride or aluminum fluoride, a polyolefinic polymer represented by polyvinylphenol, polyimide, polymethyl methacrylate, polystyrene, polyvinyl alcohol, polyvinyl acetate, or polyisobutylene or a copolymer thereof may be used, for example.

A plurality of the microstructures 40 may be placed at arbitrary points on the carbon layer 20. The microstructures 40 are approximately micro- or nano-scale structures, and there is no particular limit on the size or shape thereof. In addition, the microstructures 40 may be formed by growing upward from the carbon layer 20. This means that the microstructures 40 are not necessarily formed perpendicular to the carbon layer 20 but formed by a bottom up method in which the microstructures 40 are stacked upward with respect to a plate surface of the carbon layer 20 from a part in contact with the carbon layer 20 as a starting point.

The microstructures 40 manufactured by the bottom-up method may grow into an excellent crystalline material having very low dislocation density, in spite of the difference in material constant (e.g., lattice constant or thermal expansion coefficient) from the carbon layer 20. Accordingly, the microstructures 40 formed by the bottom-up method may have superior crystallinity to the structure manufactured by a top-down method based on thin-film deposition and etching processes. That is, electrical and optical characteristics of the microstructures 40 may have excellent electrical and optical characteristics, and therefore a high-efficiency light-emitting element 1 may be manufactured.

The microstructures 40 may be grown upward from damages formed in the carbon layer 20, and detailed description thereof will be given later.

There is no particular limit on the material used for the microstructures 40, and ZnO, ZnMgO, ZnCdO, ZnMgCdO, ZnBeO, ZnMgBeO, ZnMnO, ZnMgMnO, GaN, AlN, GaAlN, or InGaN may be used, for example.

Figure 9A:
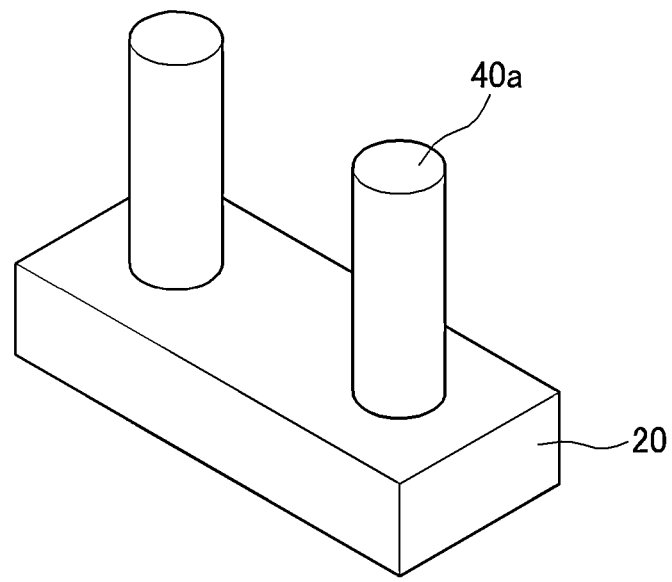
FIGS. 9A to 9E are perspective views showing various shapes of microstructures.
Figure 9B:
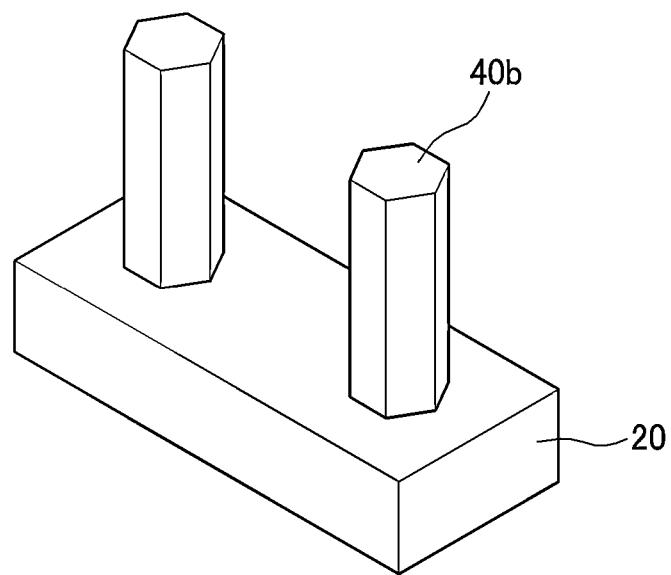
Figure 9C:
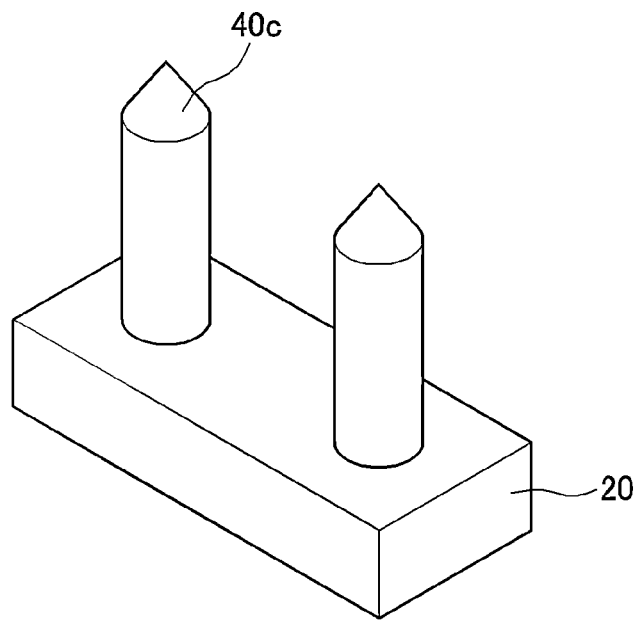
Figure 9D:
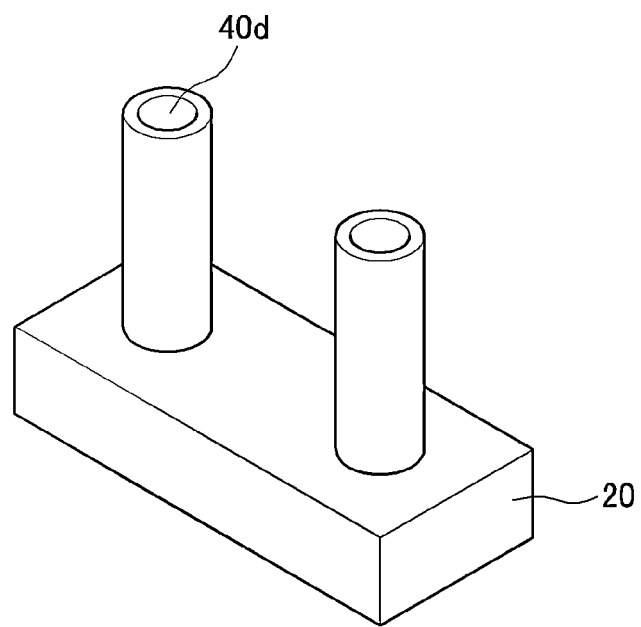
Figure 9E:
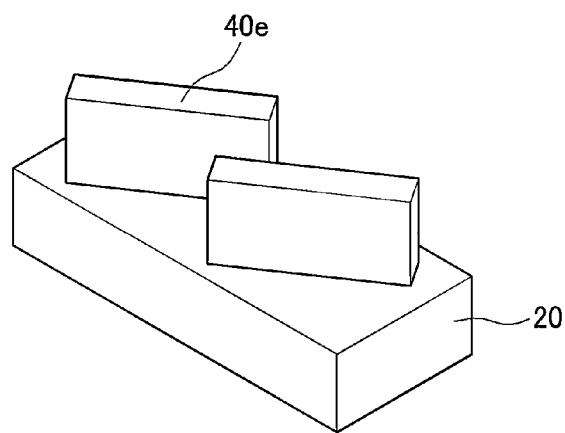

There is no particular limit on the shape of microstructures 40 and, for example, a cylindrical micro-bar 40a illustrated in FIG. 9A, a polyprism-shaped micro-bar 40b illustrated in FIG. 9B, a micro-needle 40c illustrated in FIG. 9C, a microtube 40d illustrated in FIG. 9D, and a micro-wall 40e illustrated in FIG. 9E may be possible.

The light-emitting structure layer 50 may be formed on a surface of the microstructures 40. For example, as shown in FIG. 1, the light-emitting structure layer 50 may be formed to be long along at least a side of the microstructures 40. The light-emitting structure layer 50 may be formed on a side of the microstructures 40 and not be formed on a top surface of the microstructures 40. When the microstructures 40 have nano-scale wire (nano-wire) shapes, a structure in which the heterostructure light-emitting structure layer 50 as shown in the embodiment of the present invention is stacked in a coaxial direction of the microstructures 40 is called a coaxial heterostructure nano-wire (COHN).

In FIG. 1, the light-emitting structure layer 50 is described as covering the entire microstructures 40, but the present invention is not limited thereto. For example, the light-emitting structure layer 50 may be not formed on the top surface of the microstructures 40.

The light-emitting structure layer 50 may be disposed on a top surface of the insulating layer 30 not to be in contact with the carbon layer 20. In this case, as shown in FIG. 1, a lower side surface of the microstructures 40 may be in contact with the carbon layer 20, the light-emitting structure layer 50 may be in contact with an upper side surface of the microstructures 40 and the insulating layer 30, and therefore the light-emitting structure layer 50 and the carbon layer 20 are not in contact with each other.

The light-emitting structure layer 50 may be formed in a multi-layered thin-film structure, and include, for example, an n-type semiconductor layer 52, a quantum active layer 54, and a p-type semiconductor layer 56.

The n-type semiconductor layer 52 may be formed on a surface of the microstructures 40 and formed of a semiconductor material doped with n-type impurities. Silicon, germanium, selenium, tellurium, or carbon may be used as the n-type semiconductor material, and GaN, AlN, GaAlN, or InGaN may be used as a semiconductor material, but the present invention is not limited thereto.

The quantum active layer 54 may be formed on a surface of the n-type semiconductor layer 52 and emit light due to an applied voltage. Specifically, the quantum active layer 54 may be configured by alternately stacking a plurality of quantum barrier layers 542 and a plurality of quantum well layers 544 (see FIG. 8B), and have characteristics of emitting light by the recombination of electrons and holes. The quantum barrier layer 542 may be formed of GaN, InGaN, AlN, GaAlN, ZnO, ZnMgO, ZnCdO, ZnMgCdO, ZnBeO, ZnMgBeO, ZnMnO, or ZnMgMnO, but is not limited thereto. In addition, the quantum well layer 544 may be formed of GaN, InGaN, AlN, GaAlN, ZnO, ZnMgO, ZnCdO, ZnCdO, ZnMgCdO, ZnBeO, ZnMgBeO, ZnMnO, or ZnMgMnO, but is not limited thereto.

The p-type semiconductor layer 56 may be formed on a surface of the quantum active layer 54, and formed of a semiconductor material doped with p-type impurities. Mg, Zn, or Be may be used as the p-type impurities, and GaN, AlN, GaAlN, or InGaN may be used as the semiconductor material, but the present invention is not limited thereto.

The first electrode layer 60 may be formed on the light-emitting structure layer 50. The first electrode layer 60 may be formed of a conductive material, for example, a metal such as Au, Ni, Ti, or Cr, a transparent conductive oxide (TCO) such as indium tin oxide (ITO), indium zinc oxide (IZO), aluminum zinc oxide (AZO), or indium zinc tin oxide (IZTO), a conductive polymer, or graphene, etc. The light-emitting element 1 may emit light by connecting the first electrode layer 60, the carbon layer 20, or a second electrode layer 80 (to be described later) to an external power source through a lead, etc.

As described above, the light-emitting element in accordance with the embodiment of the present invention may have dramatically improved physical/chemical properties by using the carbon layer 20 including graphene. This is due to the following characteristics of graphene.

First, graphene has excellent electrical conductivity. Accordingly, the carbon layer 20 itself which includes graphene may be used as an electrode, and the contact resistance may be small even when a separate electrode is installed in the carbon layer 20. When the carbon layer 20 itself is used as the electrode, the process time and cost may be reduced since the structure is relatively simple compared to when an extra electrode is installed.

In addition, graphene has superior thermal conductivity. Accordingly, since the heat dissipation characteristics of the light-emitting element 1 are excellent, it is easy to manufacture a high-power device. This is one characteristic that is especially superior to a light-emitting element based on a sapphire substrate in the related art.

In addition, graphene has excellent chemical and mechanical stability, and especially has flexibility and ductility. In addition, the carbon layer 20 including graphene may be manufactured to be transparent.

Further, graphene and structures thereon may be separated from the substrate 10 to be transferred. When a light-emitting diode is manufactured in the related art, there is a limitation in selecting a substrate in a material preparation process (e.g. growth, deposition, etc.) due to the material constant. However, there is no limitation in selecting a substrate in the present invention because graphene is easily separated and transferred. That is, the graphene and the structure thereon may be separated from an original substrate and transferred onto another substrate having desired properties. For example, it is freely transferred to a polymer substrate which is flexible and deformable, a transparent substrate, or a substrate with excellent thermal conductivity.

In the light-emitting element 1 in accordance with an embodiment of the present invention, since the microstructures 40 are grown on the carbon layer 20, and the light-emitting structure layer 50 is formed on the microstructures 40, the surface area of the light-emitting structure layer 50 may be much greater than that of a simple thin-film structure. Accordingly, luminous efficiency of the light-emitting element 1 may increase. In addition, since electrons are transported along the elongated microstructures 40 extending on the carbon layer 20, the transport efficiency is excellent. Further, since the first electrode layer 60 and the light-emitting structure layer 50 form a face-to-face contact, the contact resistance may decrease.

Further, the microstructures 40 may have better light-emitting characteristics than the thin-film structure in the related art, by using an embossing effect on a surface thereof.

FIGS. 2 to 7 are cross-sectional views showing a light-emitting element in accordance with another embodiment of the present invention. In FIGS. 2 to 5, the same reference numerals will be used to refer to the same or similar components described in the previous embodiment, and a duplicate description will be omitted.

Figure 2:
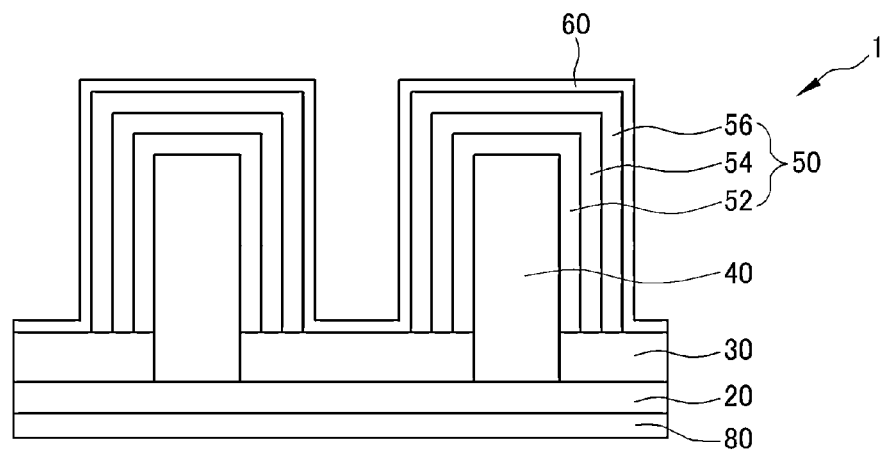
FIGS. 2 to 7 are cross-sectional views showing a light-emitting element in accordance with another embodiment of the present invention.

First, referring to FIG. 2, a second electrode layer 80 may be formed on a bottom surface of the carbon layer 20. Since the second electrode layer 80 forms a face-to-face contact with the carbon layer 20, contact resistance may be small. The second electrode layer 80, similar to the first electrode layer 60, may be formed of a conductive material, for example, a metal such as Au, Ni, Ti, or Cr, a transparent conductive oxide (TCO) such as indium tin oxide (ITO), indium zinc oxide (IZO), aluminum zinc oxide (AZO), or indium zinc tin oxide (IZTO), a conductive polymer, or graphene, etc.

Figure 3:
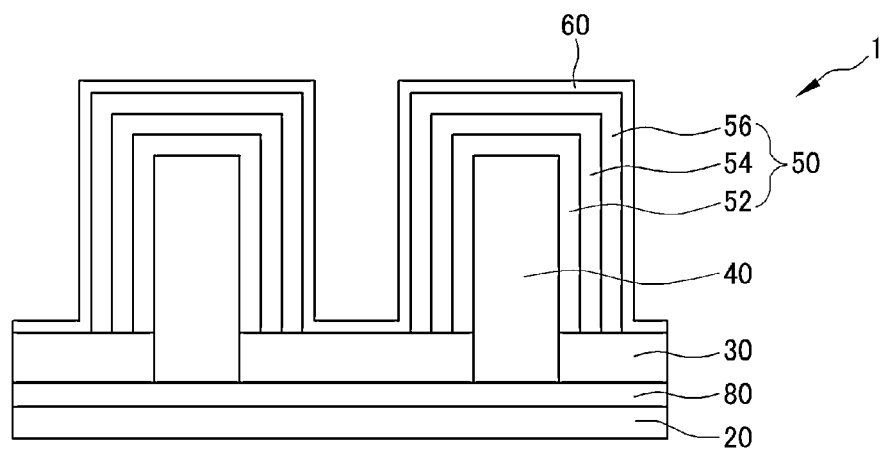

In another embodiment, as shown in FIG. 3, the second electrode layer 80 may be formed between the carbon layer 20 and the insulating layer 30. In this case, the carbon layer 20 and the second electrode layer 80 are electrically isolated from the light-emitting structure layer 50 and the first electrode layer 60.

Figure 4:
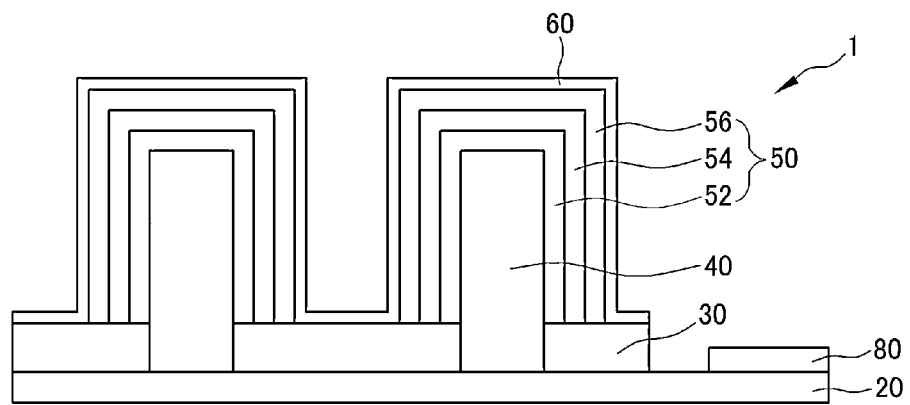

In still another embodiment, as shown in FIG. 4, the second electrode layer 80 may be formed not between the carbon layer 20 and the insulating layer 30, but at a separate area on a top surface of the carbon layer 20.

Figure 5:
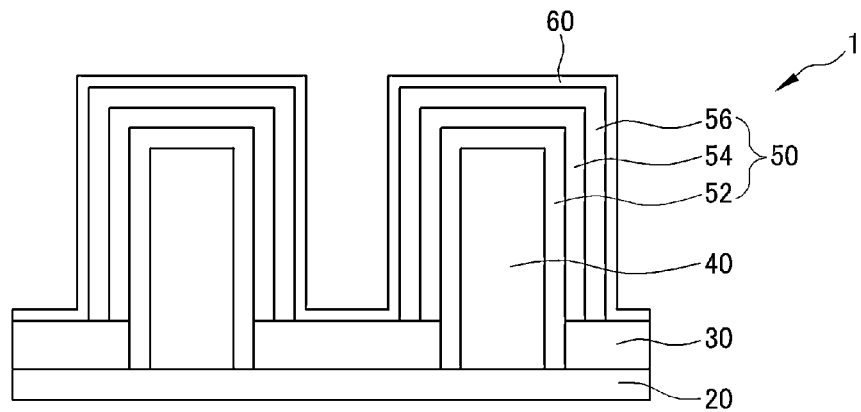

Although it is described in all the previous embodiments of the present invention that the insulating layer 30 is in contact with a lower side surface of the microstructures 40, the n-type semiconductor 52 may cover the entire side surface of the microstructures 40, and a lower side surface of the n-type semiconductor layer 52 may be in contact with the insulating layer 30, as shown in FIG. 5.

Figure 6:
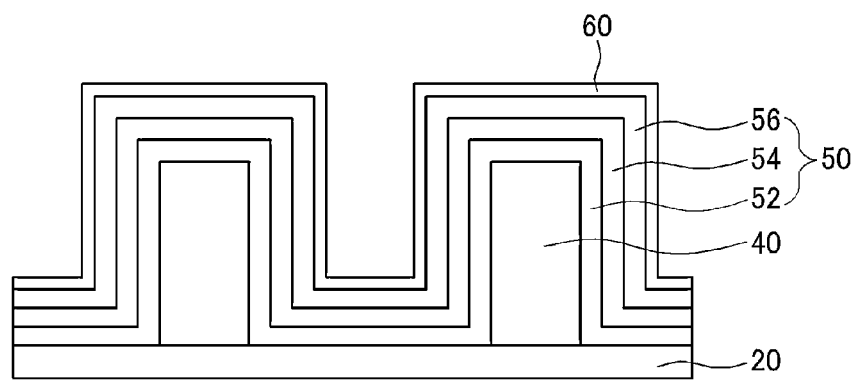

Further, although it is described in all the previous embodiments of the present invention that the insulating layer 30 is formed, the insulating layer 30 is not absolutely required. For example, as shown in FIG. 6, when the n-type semiconductor layer 52 is formed to cover a top surface of the carbon layer 20 in such a way that the carbon layer 20 is not in contact with the first electrode layer 60, the insulating layer 30 may not be arranged between the carbon layer 20 or second electrode layer (not shown) and the first electrode layer 60.

Figure 7:
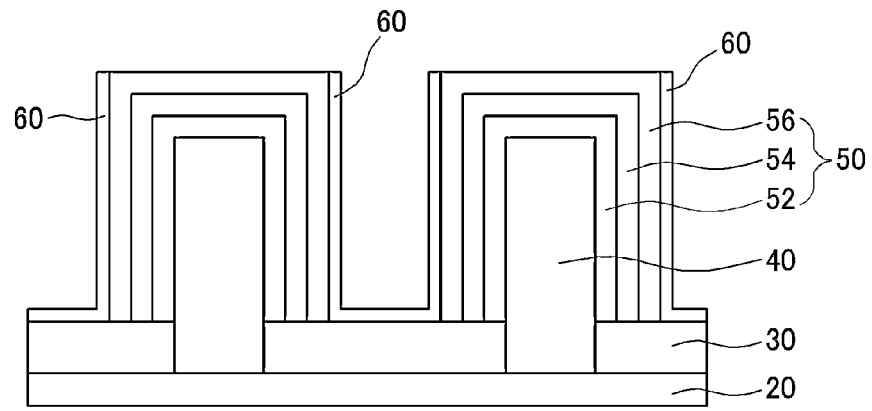

In still another embodiment, the first electrode layer 60 may be formed only on a part of the p-type semiconductor layer 56. For example, as shown in FIG. 7, the first electrode layer 60 may be disposed only on a side surface of the p-type semiconductor layer 56 and not disposed on a top surface of the p-type semiconductor layer 56. When the first electrode layer 60 is formed only on a part of the p-type semiconductor layer 56, the area in which the first electrode layer 60 is not disposed may function as a light-emitting pathway, which is particularly useful when the first electrode layer 60 is not transparent. In addition, although not shown, the second electrode layer 80 may also be formed at only a part of a surface of the carbon layer 20. The first electrode layer 60 and/or the second electrode layer 80 may be formed in a grid shape.

Figure 8A:
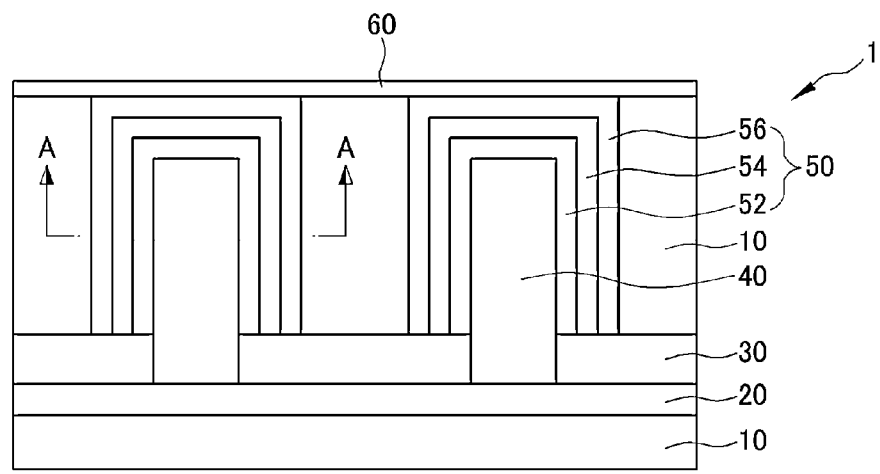
FIG. 8A is a cross-sectional view showing a light-emitting diode in accordance with still another embodiment of the present invention.
Figure 8B:
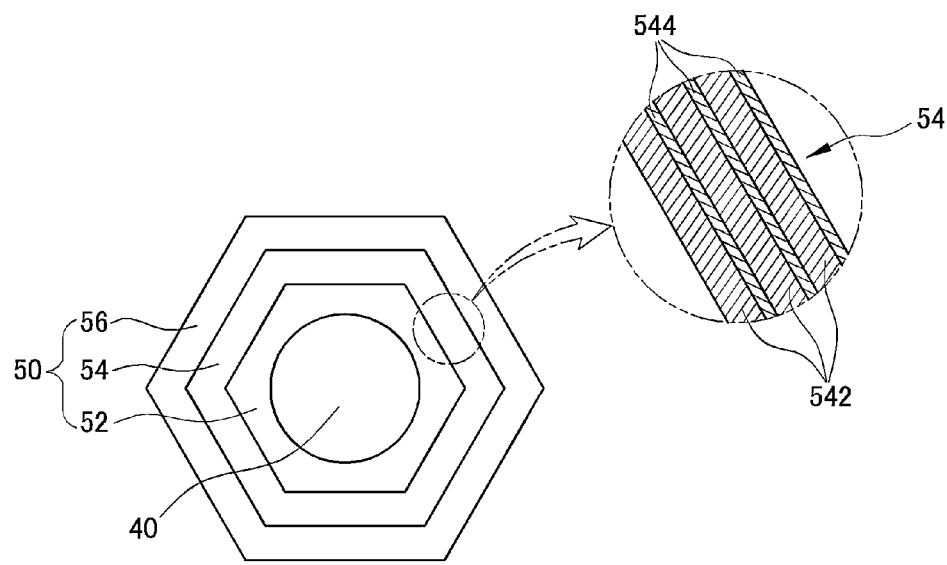
FIG. 8B is an enlarged cross-sectional view taken along line A-A' of FIG. 5A.

FIG. 8A is a cross-sectional view showing a light-emitting diode in accordance with still another embodiment of the present invention, and FIG. 8B is an enlarged cross-sectional view taken along line A-A' of FIG. 5A. The same reference numerals will be used to refer to the same or similar components described in the previous embodiment, and a duplicate description will be omitted.

According to the embodiment of the present invention, a trench made by the light-emitting structure layer 50 and the insulating layer 30 may be filled with an insulating material 70 such as spin-on glass (SOG). In this case, the insulating material 70 may not fully cover the p-type semiconductor layer 56, and the first electrode layer 60 may be disposed thereon to be in contact with the insulating material 70 and the p-type semiconductor layer 56. In FIG. 8A, the substrate 10 is described as being in contact with a bottom surface of the carbon layer 20, but is not limited thereto. For example, as shown in FIGS. 2 to 5, the substrate 10 may not be disposed on a bottom surface of the carbon layer 20. In addition, as shown in FIGS. 2 to 4, the second electrode layer 80 may be in contact with the carbon layer 20 and, as shown in FIG. 5, the n-type semiconductor layer 52 may be in contact with the carbon layer 20.

Although it is described in the previous embodiments of the present invention that separated semiconductor layers are formed on the microstructures 40, the present invention is not limited thereto. For example, the microstructures 40 themselves may function as the n-type semiconductor layer (not shown). In this case, a quantum active layer and a p-type semiconductor layer may be formed on the microstructures 40.

Further, although it is described in the previous embodiments of the present invention that an n-type semiconductor layer, a quantum active layer, and a p-type semiconductor layer are sequentially formed on the microstructures 40, the present invention is not limited thereto. For example, the p-type semiconductor layer, the quantum active layer, and the n-type semiconductor layer may be sequentially formed on the microstructures 40. In addition, the microstructures 40 themselves may function as the p-type semiconductor layer. In this case, the quantum active layer and the n-type semiconductor layer may be formed on the microstructures 40.

Further, the microstructures 40 may have a hetero junction structure. For example, the n-type semiconductor layer may be formed on the microstructures 40.

Although it is described in all the previous embodiments of the present invention the light-emitting structure layer 50 is only configured of the n-type semiconductor layer 52, the quantum active layer 54, and the p-type semiconductor layer 56, the present invention is not limited thereto. For example, the light-emitting structure layer 50 may include an n-GaN layer (a kind of n-type semiconductor layer), an InGaN layer, and a p-GaN layer (a kind of p-type semiconductor layer), and an undoped GaN layer may be formed between the microstructures 40 and the n-GaN layer in order to improve lattice matching between the microstructures 40 and the n-GaN layer, and a metal layer for forming a ohmic contact may be formed between the p-GaN layer and the first electrode layer 60 in order to flow current between the p-GaN layer and the first electrode layer 60.

Figure 10A:
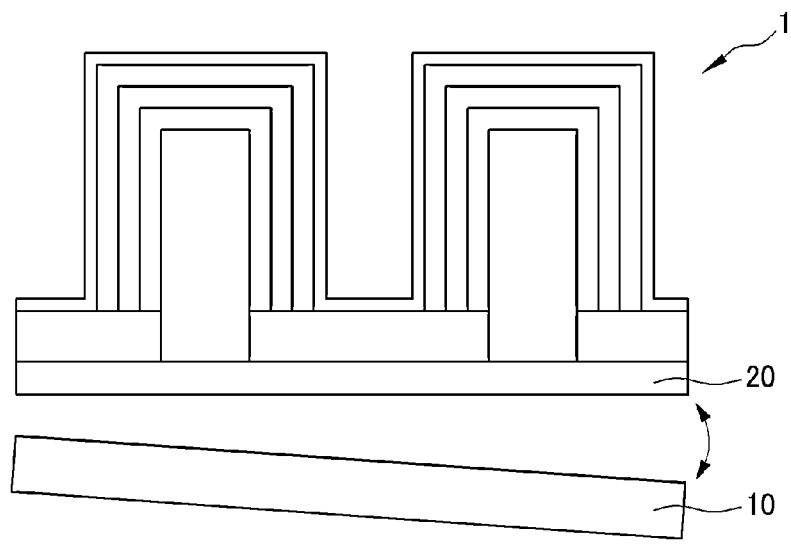
FIGS. 10A and 10B are schematic views showing a transfer process of graphene.
Figure 10B:
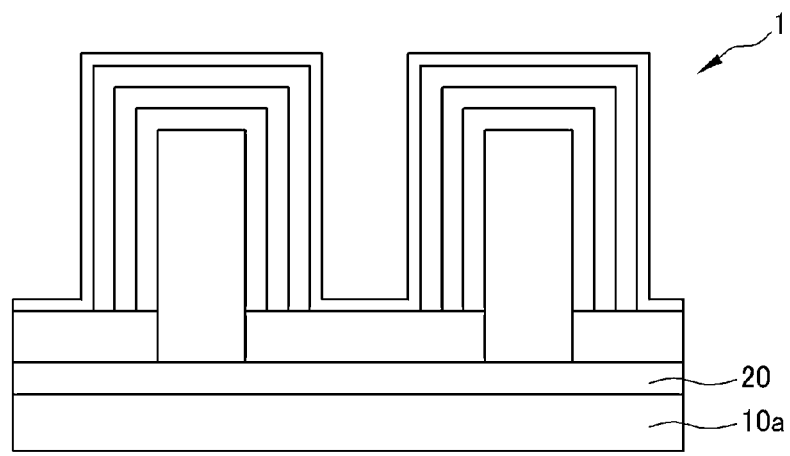

FIGS. 10A and 10B are schematic views showing a transfer process of graphene. As described above, graphene is easily separated from a substrate to be transferred. That is, the carbon layer 20 and the structures thereon may be separated from the lower substrate 10 (see FIG. 10A), and the separated carbon layer 20 and structures thereon may be transferred to another substrate 10a (see FIG. 10B). The carbon layer 20 and the substrate 10 may be separated by only a mechanical force, which is called mechanical lift-off. It has been experimentally proven that the carbon layer 20 and the structures thereon are separated from a substrate by mechanical lift-off and transferred to another substrate such as a sapphire substrate, a glass substrate, a metal substrate, or a polymer substrate.

When the carbon layer 20 includes multi-layered graphene, the carbon layer 20 itself may be separated into single-layered graphene and the rest of the carbon layer 20.

So far, the configuration of the light-emitting element in accordance with an embodiment of the present invention has been described. Hereinafter, a method of manufacturing a light-emitting element in accordance with an embodiment of the present invention will be described with reference to accompanying drawings.

FIGS. 11A to 11G are cross-sectional views sequentially showing process steps for manufacturing a light-emitting element in accordance with an embodiment of the present invention.

Figure 11A:
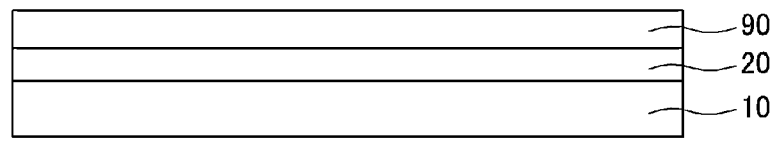
FIGS. 11A to 11G are cross-sectional views sequentially showing process steps for manufacturing a light-emitting element in accordance with an embodiment of the present invention.

First, as shown in FIG. 11A, a substrate 10 on which a carbon layer 20 including graphene is formed may be prepared, and a mask layer 90 may be formed on the carbon layer 20. The method of forming the carbon layer 20 including graphene on the substrate 10 may be a chemical vapor deposition (CVD) method, but the present invention is not limited thereto. For example, the graphene may be used by being mechanically or chemically separated from single crystalline graphite. As the CVD method, a rapid thermal chemical vapor deposition (RTCVD) method, a plasma-enhanced chemical vapor deposition (PECVD) method, an inductively coupled plasma-enhanced chemical vapor deposition (ICPCVD) method, and a metal-organic chemical vapor deposition (MOCVD) method may be used, as well as a normal CVD method.

In this embodiment, the carbon layer 20 is described as being located on the substrate 10, but the carbon layer 20 itself may be used as a substrate without using the substrate 10.

Figure 11B:
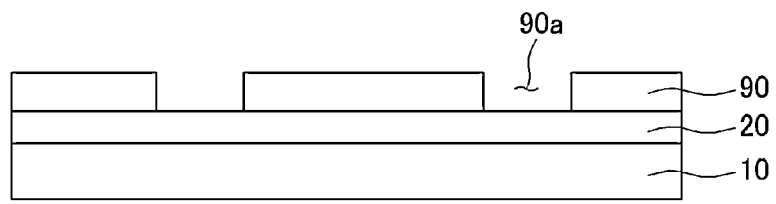

Next, as shown in FIG. 11B, the mask layer 90 may be patterned to form a plurality of openings 90a. The method of patterning the mask layer 90 is well-known in the field of the semiconductor manufacturing process, and a method such as e-beam lithography, photolithography, laser interference lithography, or nano-imprint may be available. In addition, a patterning method using a template such as an anodic aluminum oxide or block copolymer may be used.

Figure 11C:
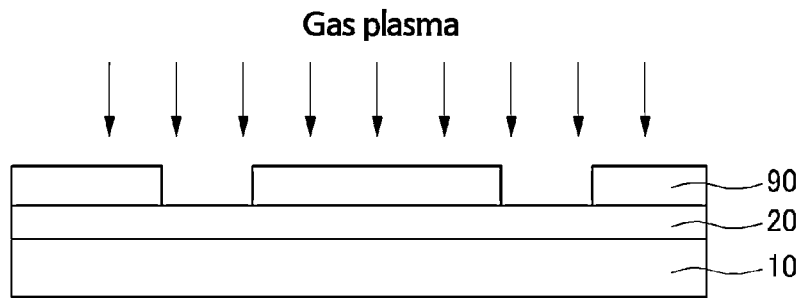

Next, as shown in FIG. 11C, damages (not shown) may be generated in a surface of the carbon layer 20 through the openings 90a formed in the mask layer 90. The damages may be generated using a gas plasma as shown in FIG. 9C, or using an ion-beam, an electron beam, a proton beam, or a neutron beam, but are not limited thereto. Gas for the gas plasma may be $O_2$, $N_2$, $Cl_2$, H, Ar, $CF_4$, $SF_6$, $BCl_3$, or ozone, etc., but is not limited thereto.

Figure 11D:
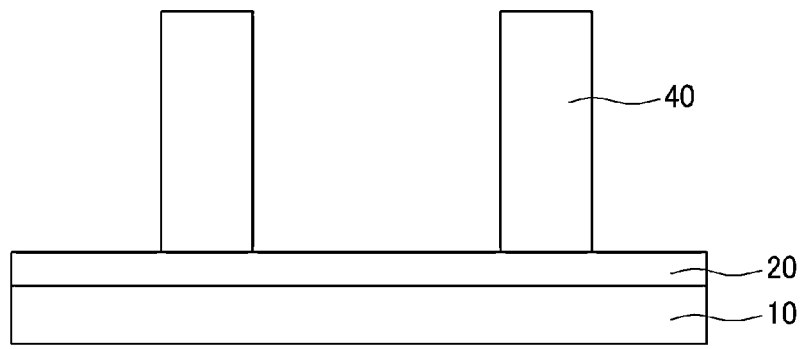

Next, as shown in FIG. 11D, the mask layer 90 may be removed after the microstructures 40 are grown from the damages.

As a method of growing the microstructures 40 on the carbon layer 20, a CVD method including an MOCVD method, a physical deposition method such as sputtering, thermal or electron beam evaporation, and pulsed laser deposition, or a vapor-phase transport process using a metal catalyst such as Au may be used. When using a catalyst-free MOCVD method in which the catalyst is not used, it is possible to avoid contamination due to the catalyst and manufacture the microstructures 40 showing excellent electrical and optical performance.

Generally, since the surface of graphene is chemically very stable and has low reactivity, it is difficult to grow a thin-film or microstructure on the graphene. That is, since materials are grown only from surface defects or step edges of the graphene, it is difficult to form a microstructure at a desired level in the related art.

However, according to the method of manufacturing a light-emitting element in accordance with the embodiment of the present invention, by intentionally forming damages on the surface of graphene, nucleation and growth may occur from the damage as a beginning point. Therefore, it is possible to form microstructures on graphene, and furthermore, it is easy to control the location and density of the microstructures.

So far, the location and density of the microstructures 40 have been described as being controlled by patterning and generation of the damages, but the present invention is not limited thereto. For example, the damages may be formed on the carbon layer 20 by directly performing gas-plasma etching on the carbon layer 20 without using the mask layer 90. In addition, it is possible to inject an ion-beam onto the carbon layer 20 without using the mask layer 90. In this case, the location and density of the microstructures 40 may be controlled by adjusting the injection position of the ion-beam, without using the mask layer 90.

In addition, it is not absolutely required to generate damages on the carbon layer 20 and grow the microstructures 40 from the damages. For example, the microstructures 40 may be directly grown on the carbon layer 20 by adjusting process conditions such as temperature and pressure.

Figure 11E:
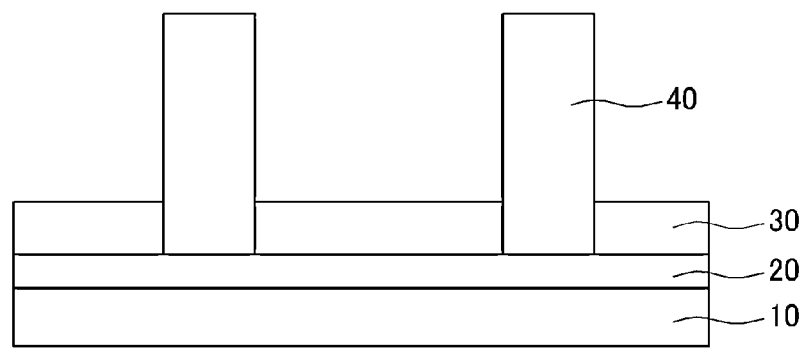

Next, as shown in FIG. 11E, an insulating layer 30 may be formed on the carbon layer 20. The insulating layer 30 may be formed only on the carbon layer 20 using a material with high selectivity, or formed only on a top surface of the carbon layer 20 and a lower side surface of the microstructures 40 using a partial etching process, etc. after stacking the insulating layer 30 on the carbon layer 20 and the microstructures 40.

Figure 11F:
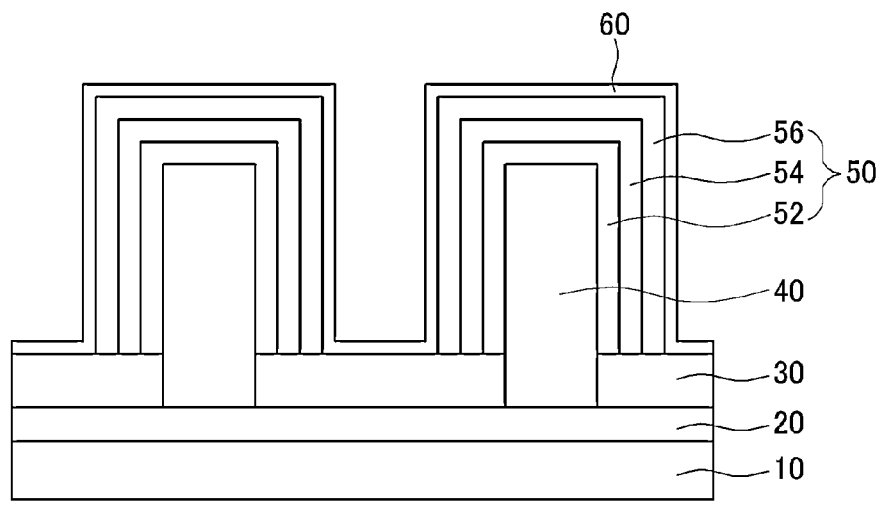

Next, as shown in FIG. 11F, a light-emitting structure layer 50 and a first electrode layer 60 may be sequentially formed on the microstructures 40 in a direction perpendicular to the carbon layer 20. The formation of the light-emitting structure layer 50 may include forming an n-type semiconductor layer 52, forming a quantum active layer 54 on a surface of the n-type semiconductor layer 52, and forming a p-type semiconductor layer 56 on a surface of the quantum active layer 54.

Figure 11G:
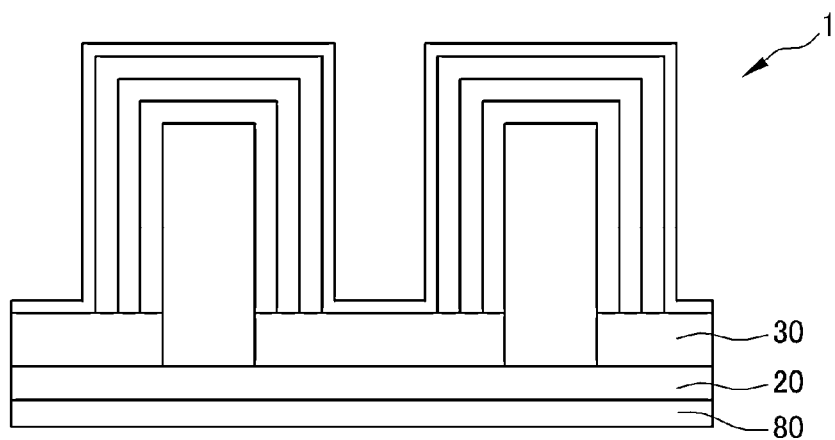

Finally, as shown in FIG. 11G, the substrate 10 disposed on a bottom surface of the carbon layer 20 may be removed, and a second electrode layer 80 may be formed.

So far, a method of manufacturing a light-emitting element in accordance with an embodiment of the present invention has been described, but the present invention is not limited to this embodiment. For example, the carbon layer 20 itself including the graphene may be used as an electrode without forming the second electrode layer 80.

In addition, the second electrode layer 80 may be formed on the carbon layer 20 before the insulating layer 30 is formed. In this case, the second electrode layer 80 may be disposed between the carbon layer 20 and the insulating layer 30. Further, the second electrode layer 80 may be formed not between the carbon layer 20 and the insulating layer 30 but at a separated area on the top surface of the carbon layer 20.

Further, the insulating layer 30 may be formed after the n-type semiconductor layer 52 is formed on the microstructures 40.

Further, it is possible to form the light-emitting structure layer 50, fill the trench made by the light-emitting structure layer 50 and the insulating layer 30 with the insulating material 70, and then form the first electrode layer 60 to be in contact with the insulating material 70 and the p-type semiconductor layer 56.

Experimental Embodiment

A light-emitting element was manufactured using a method of manufacturing a light-emitting element in accordance with an embodiment of the present invention.

First, a mask layer is formed on a few-layer graphene sheet, and then arrays of circular openings having a diameter of 200 nm are patterned in the mask layer using electron-beam lithography. Next, the mask layer is removed, and ZnO microstructures are vertically grown from damages as beginnings point by a metal-organic vapor phase epitaxy (MOVPE) method.

Figure 12A:
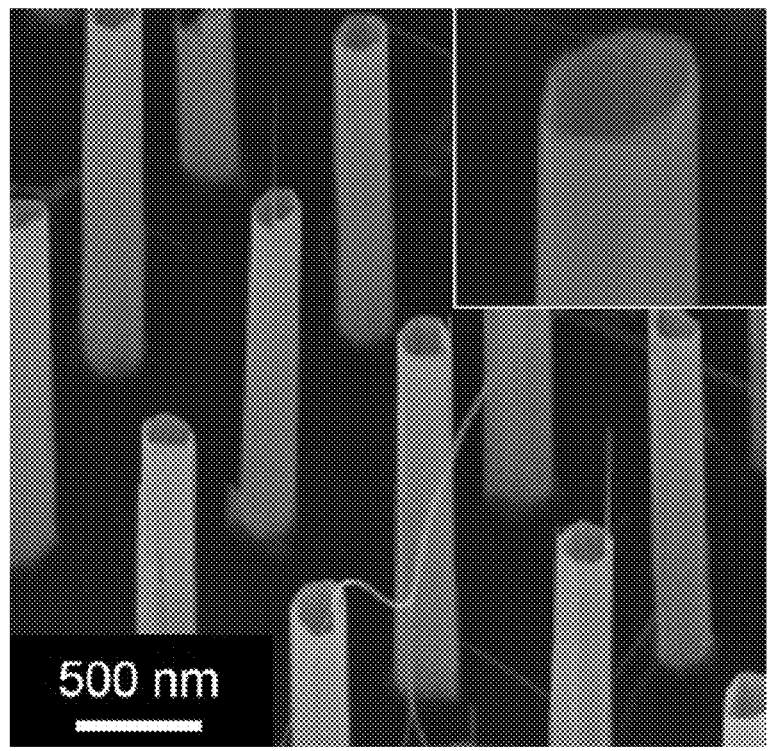
FIGS. 12A and 12B are scanning electron microscope (SEM) images showing ZnO microstructures grown on graphene.
Figure 12B:
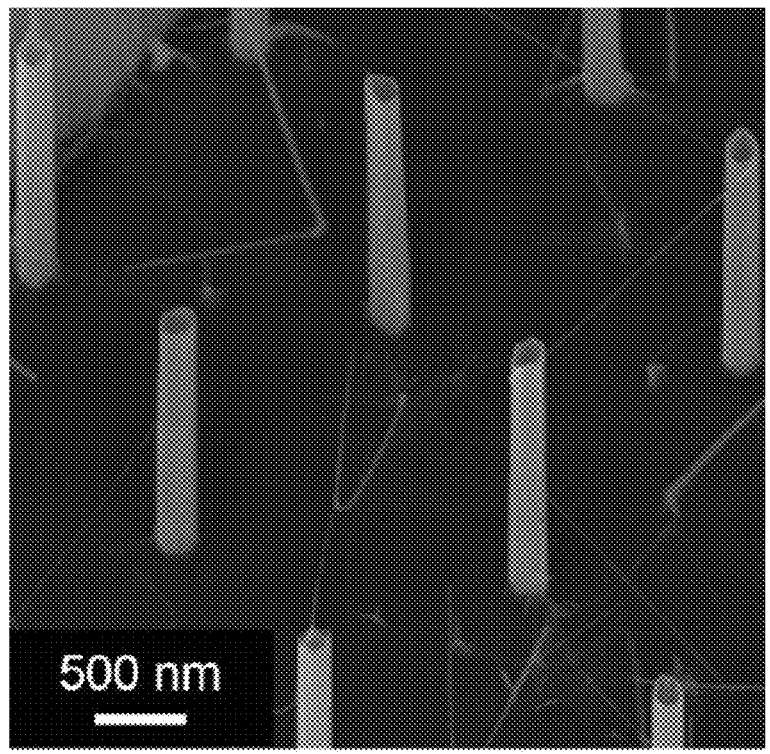

FIGS. 12A and 12B are a scanning electro-microscope (SEM) image showing ZnO microstructures grown on graphene. The pitch between the microstructures is 1 μm in FIG. 12A and 2 μm in FIG. 12B. In both cases, the microstructures have cylindrical shapes with a height of 2.2±0.3 μm and a diameter of 200±10 nm.

Next, a light-emitting structure layer having a GaN-based p-n homojunction is formed on the ZnO microstructures. More specifically, a Si-doped n-GaN layer, a third group GaN/InxGa1−xN multiple quantum well (MQW; quantum active layer), and a Mg-doped p-GaN layer form a coaxial junction with the ZnO microstructures.

Figure 13A:
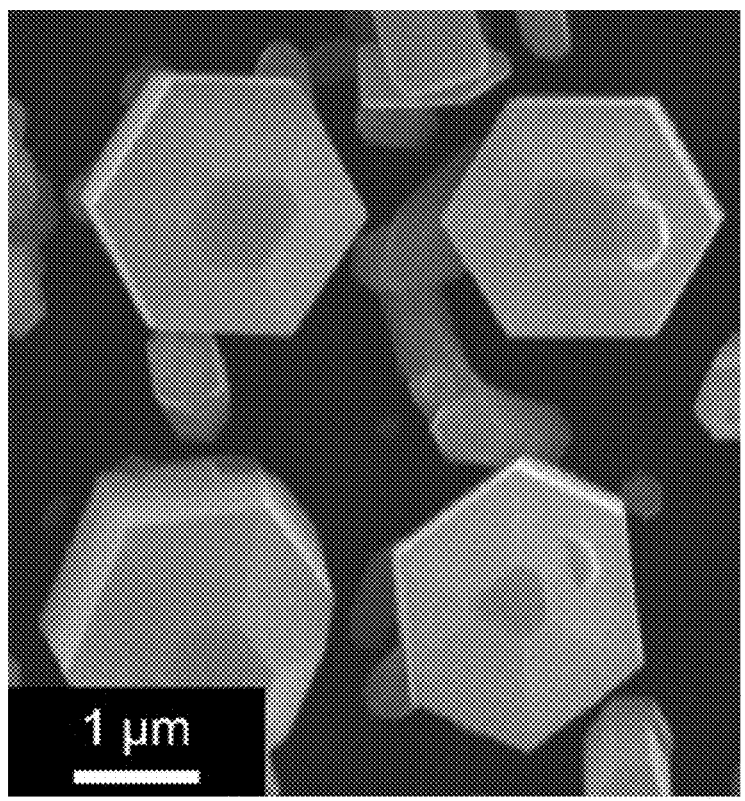
FIGS. 13A and 13B are SEM images showing a light-emitting structure layer formed on ZnO microstructures grown on graphene.

FIG. 13A is a scanning electron microscope (SEM) image showing a light-emitting structure layer formed on the ZnO microstructures. As shown from the hexagonal shape in the drawings, a single crystalline GaN/In$_x$Ga$_{1-x}$N layer is formed well by a hetero-epitaxial method.

Figure 13B:
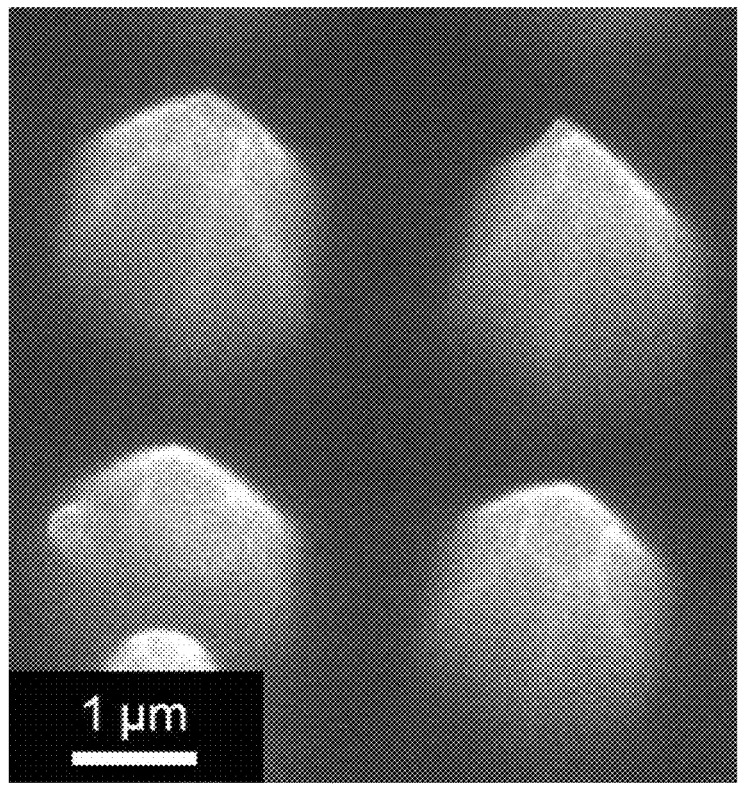

Next, an SOG insulating material fills between the microstructures, and a Ni/Au metal electrode (10 nm/10 nm) is formed to be in contact with the p-GaN layer. FIG. 13B is an SEM image taken after filling between the microstructures with the SOG insulating material.

Figure 14:
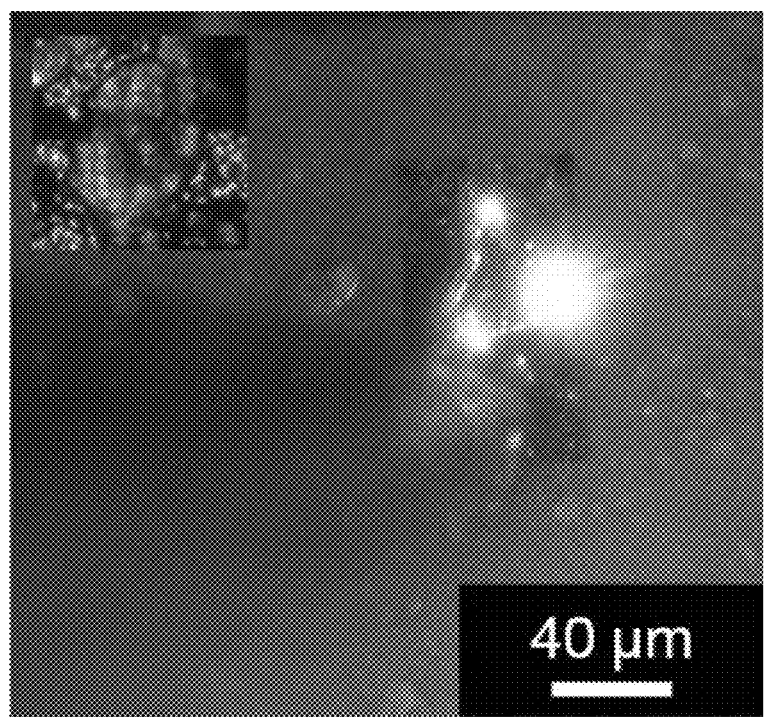
FIG. 14 is an optical microscope photograph showing light being emitted from a light-emitting element in accordance with an embodiment of the present invention.

FIG. 14 is an optical microscope photograph showing light being emitted from a light-emitting element in accordance with the above experimental embodiment. Emission of observable purple light is confirmed.

Figure 15:
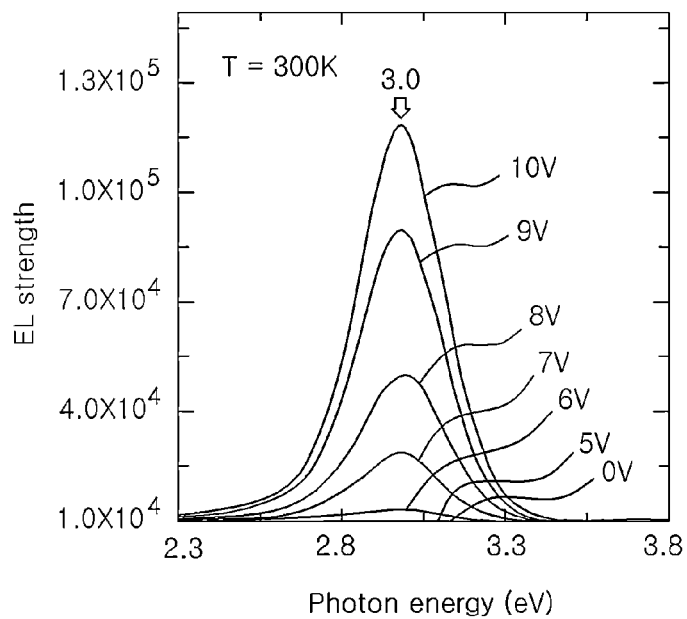
FIG. 15 is a graph showing an electroluminescence spectrum measured at various applied voltage levels in a light-emitting element in accordance with an embodiment of the present invention.

FIG. 15 is a graph showing an electroluminescence spectrum measured at various applied voltage levels in a light-emitting element in accordance with an embodiment of the present invention. At a bias voltage above about 5 V, the electroluminescence spectrum has a peak point at 3.0 eV. This corresponds to purple light.

Figure 16:
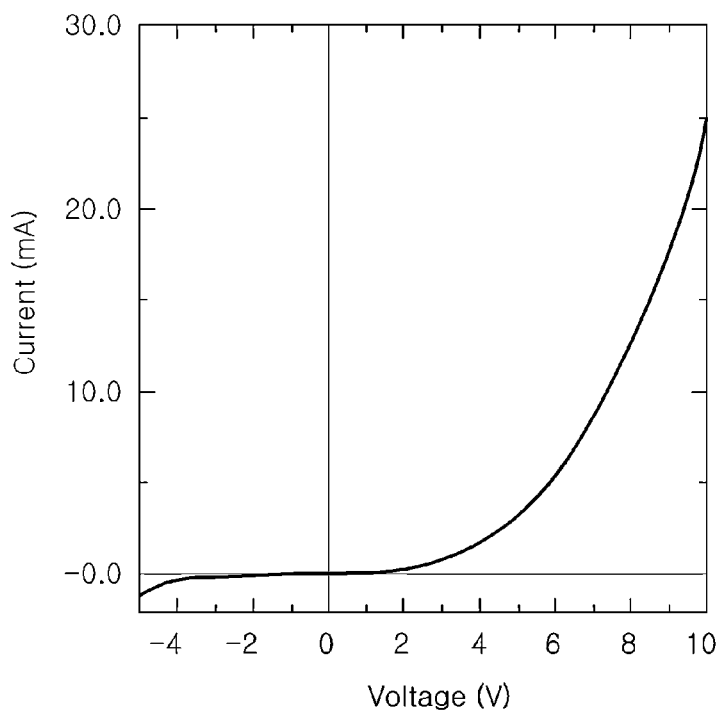
FIG. 16 is a graph showing a current-voltage characteristic curve of a light-emitting element in accordance with an embodiment of the present invention.

FIG. 16 is a graph showing a current-voltage characteristic curve of a light-emitting element in accordance with an embodiment of the present invention. Rectifying characteristics are shown at a turn-on voltage of 5 V, and the leakage current of $5\times10^{-3}$ A is measured at −5 V.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this present invention as defined in the claims.

In the claims, means-plus-function clauses are intended to cover the structures described herein as performing the recited function, and not only structural equivalents but also equivalent structures.

The invention claimed is:

1. A light-emitting element, comprising:
   a carbon layer including graphene;
   a plurality of microstructures grown upward from the carbon layer;
   a light-emitting structure layer formed on surfaces of the microstructures;
   a first electrode layer formed on the light-emitting structure layer; and
   an insulating layer disposed between the first electrode layer and the carbon layer,
   wherein the light-emitting structure layer is disposed on the insulating layer not to be in contact with the carbon layer.

2. The light-emitting element of claim 1, further comprising:
   a substrate disposed below the carbon layer.

3. The light-emitting element of claim 2, wherein the carbon layer and the substrate are separable.

4. The light-emitting element of claim 1, wherein the microstructures are grown upward from damages formed in the carbon layer.

5. The light-emitting element of claim 1, further comprising:
   a second electrode layer formed on a surface of the carbon layer.

6. The light-emitting element of claim 1, wherein the microstructures comprise a structure selected from the group consisting of a micro-bar, a micro-needle, a micro-tube, and a micro-wall.

7. The light-emitting element of claim 1, wherein the light-emitting structure layer comprises an n-type semiconductor layer, a p-type semiconductor layer, and a quantum active layer disposed between the n-type semiconductor layer and the p-type semiconductor layer.

8. The light-emitting element of claim 7, wherein the n-type semiconductor layer comprises gallium nitride, aluminum nitride, gallium aluminum nitride, or indium gallium nitride doped with one or more impurities selected from the group consisting of silicon, germanium, selenium, tellurium, and carbon, and
   the p-type semiconductor layer comprises gallium nitride, aluminum nitride, gallium aluminum nitride, or indium gallium nitride doped with one or more impurities selected from the group consisting of magnesium, zinc, and beryllium.

9. The light-emitting element of claim 1, wherein the microstructures comprise one or more elements selected from the group consisting of zinc oxide, zinc-magnesium oxide, zinc-cadmium oxide, zinc-magnesium-cadmium oxide, zinc-beryllium oxide, zinc-magnesium-beryllium oxide, zinc-manganese oxide, zinc-magnesium-manganese oxide, gallium nitride, aluminum nitride, gallium aluminum nitride, and indium gallium nitride.

10. A method of manufacturing a light-emitting element, comprising:
    providing a carbon layer including graphene;
    growing a plurality of microstructures upward on the carbon layer; and
    forming a light-emitting structure layer on surfaces of the microstructures,
    wherein the growing of the microstructures comprises:
       generating damages on the carbon layer; and
       growing the microstructures upward from the damages,
       wherein the generating of the damages comprises:
          forming a mask layer on the carbon layer;
          forming a plurality of openings by patterning the mask layer; and
          forming damages in the carbon layer through the openings.

11. The method of claim 10, further comprising:
    forming a first electrode layer on the light-emitting structure layer after forming the light-emitting structure layer.

12. The method of claim 10 or 11, wherein the providing of the carbon layer comprises forming a carbon layer including the graphene on a substrate.

13. The method of claim 10, wherein the forming of the damages comprises using one or more methods among a gas plasma, an ion-beam, an electron beam, a proton beam, and a neutron beam.

14. The method of claim 10, wherein the formation of the plurality of openings by patterning the mask layer includes using one or more methods among electron beam lithography, photolithography, laser interference lithography, nano-imprinting, and a template.

15. The method of claim 10 or 11, further comprising:
    forming an insulating layer on the carbon layer after growing the microstructures.

16. The method of claim 10 or 11, further comprising:
forming a second electrode layer on a surface of the carbon layer after forming the light-emitting structure layer.

17. The method of claim 10 or 11, wherein the light-emitting structure layer comprises an n-type semiconductor layer, a p-type semiconductor layer, and a quantum active layer disposed between the n-type semiconductor layer and the p-type semiconductor layer.

18. The method of claim 10 or 11, wherein the microstructures comprise a structure selected from the group consisting of a micro-bar, a micro-needle, a micro-tube, and a micro-wall.

* * * * *